(12) United States Patent
Yamaguchi et al.

(10) Patent No.: US 11,856,655 B2
(45) Date of Patent: Dec. 26, 2023

(54) SUBSTRATE PROCESSING APPARATUS AND SUBSTRATE PROCESSING METHOD

(71) Applicant: Tokyo Electron Limited, Tokyo (JP)

(72) Inventors: Hirofumi Yamaguchi, Nirasaki (JP); Yoshiaki Sasaki, Nirasaki (JP); Yuichi Nishimori, Nirasaki (JP); Atsushi Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 624 days.

(21) Appl. No.: 16/856,626

(22) Filed: Apr. 23, 2020

(65) Prior Publication Data
US 2020/0344850 A1 Oct. 29, 2020

(30) Foreign Application Priority Data
Apr. 25, 2019 (JP) ................. 2019-084002

(51) Int. Cl.
*H05B 1/02* (2006.01)
*H01L 21/677* (2006.01)
(Continued)

(52) U.S. Cl.
CPC ....... *H05B 1/0233* (2013.01); *H01L 21/6719* (2013.01); *H01L 21/67109* (2013.01); *H01L 21/67115* (2013.01); *H01L 21/67161* (2013.01); *H01L 21/67167* (2013.01); *H01L 21/67196* (2013.01); *H01L 21/67201* (2013.01);
(Continued)

(58) Field of Classification Search
CPC ......... H01L 21/67167; H01L 21/67115; H01L 21/67742; H01L 21/68771; H01L 21/68764; H01L 21/68742; H01L 21/67781; H01L 21/67754; H01L 21/67201; H01L 21/67196; H01L 21/6719; H01L 21/67161; H01L 21/67109;
(Continued)

(56) References Cited

U.S. PATENT DOCUMENTS 6,381,873 B1 * 5/2002 Peremychtchev .... F26B 25/004
427/374.1
6,483,081 B1 * 11/2002 Batchelder ........ H01L 21/67109
118/724
(Continued)

FOREIGN PATENT DOCUMENTS

JP      2017168738 A     9/2017
KR  10-2004-0106045 A  12/2004
(Continued)

*Primary Examiner* — Mary A Wilczewski
(74) *Attorney, Agent, or Firm* — Nath, Goldberg & Meyer; Jerald L. Meyer; Tanya E. Harkins

(57) ABSTRACT

A substrate processing apparatus includes: a chamber having a container including at least one substrate-heating region and at least one substrate-cooling region; a heating mechanism configured to heat a first substrate in the at least one substrate-heating region; a cooling mechanism configured to cool a second substrate in the at least one substrate-cooling region while the first substrate is being heated; and a
(Continued)

partition provided in the container and configured to separate the at least one substrate-heating region and the at least one substrate-cooling region from each other in terms of heat and pressure.

8 Claims, 9 Drawing Sheets

(51) Int. Cl.
  *H01L 21/67* (2006.01)
  *H01L 21/687* (2006.01)
  *H05B 3/28* (2006.01)

(52) U.S. Cl.
  CPC .. *H01L 21/67207* (2013.01); *H01L 21/67248* (2013.01); *H01L 21/67706* (2013.01); *H01L 21/67754* (2013.01); *H01L 21/67781* (2013.01); *H01L 21/68742* (2013.01); *H01L 21/68764* (2013.01); *H01L 21/68771* (2013.01); *H05B 3/283* (2013.01); *H01L 21/67742* (2013.01)

(58) Field of Classification Search
  CPC ......... H01L 21/67706; H01L 21/67248; H01L 21/67207; H91L 21/67207; H05B 1/0233
  See application file for complete search history.

(56) References Cited

U.S. PATENT DOCUMENTS

| | | | |
|---|---|---|---|
| 2012/0031892 A1* | 2/2012 | Shigetomi | H05B 1/0233 |
| | | | 219/444.1 |
| 2017/0266700 A1* | 9/2017 | Nagakubo | H01L 21/67248 |
| 2017/0353994 A1* | 12/2017 | Kim | H05B 3/24 |
| 2019/0006208 A1* | 1/2019 | Maki | H05B 1/0233 |
| 2020/0196389 A1* | 6/2020 | Ueno | H05B 1/0233 |
| 2020/0344850 A1* | 10/2020 | Yamaguchi | H01L 21/67207 |
| 2020/0388515 A1* | 12/2020 | Hirochi | H01L 21/6719 |
| 2021/0242054 A1* | 8/2021 | Chen | H01J 37/20 |
| 2021/0257235 A1* | 8/2021 | Kaneko | H01L 21/67248 |
| 2023/0060692 A1* | 3/2023 | Chen | H01L 21/67253 |

FOREIGN PATENT DOCUMENTS

| | | | | |
|---|---|---|---|---|
| KR | 10-2007-0093828 | * | 9/2007 | ....... H01L 21/67109 |
| KR | 10-2018-0070755 A | | 6/2018 | |
| WO | WO 2006/069256 | * | 6/2006 | ....... H01L 27/67109 |

* cited by examiner

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-084002, filed on Apr. 25, 2019, the entire contents of which are incorporated herein by reference.

TECHNICAL FIELD

The present disclosure relates to a substrate processing apparatus and a substrate processing method.

BACKGROUND

For example, Patent Document 1 proposes a technique in which a cooling chamber is provided separately from a heating chamber that heats a substrate, and the substrate that has been subjected to a heating process is cooled in the cooling chamber.

PRIOR ART DOCUMENT

Patent Document

Patent Document 1: Japanese laid-open publication No. 2017-168738

SUMMARY

A substrate processing apparatus according to an aspect of the present disclosure includes: a chamber having a container including at least one substrate-heating region and at least one substrate-cooling region; a heating mechanism configured to heat a first substrate in the at least one substrate-heating region; a cooling mechanism configured to cool a second substrate in the at least one substrate-cooling region while the first substrate is being heated; and a partition provided in the container and configured to separate the at least one substrate-heating region and the at least one substrate-cooling region from each other in terms of heat and pressure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
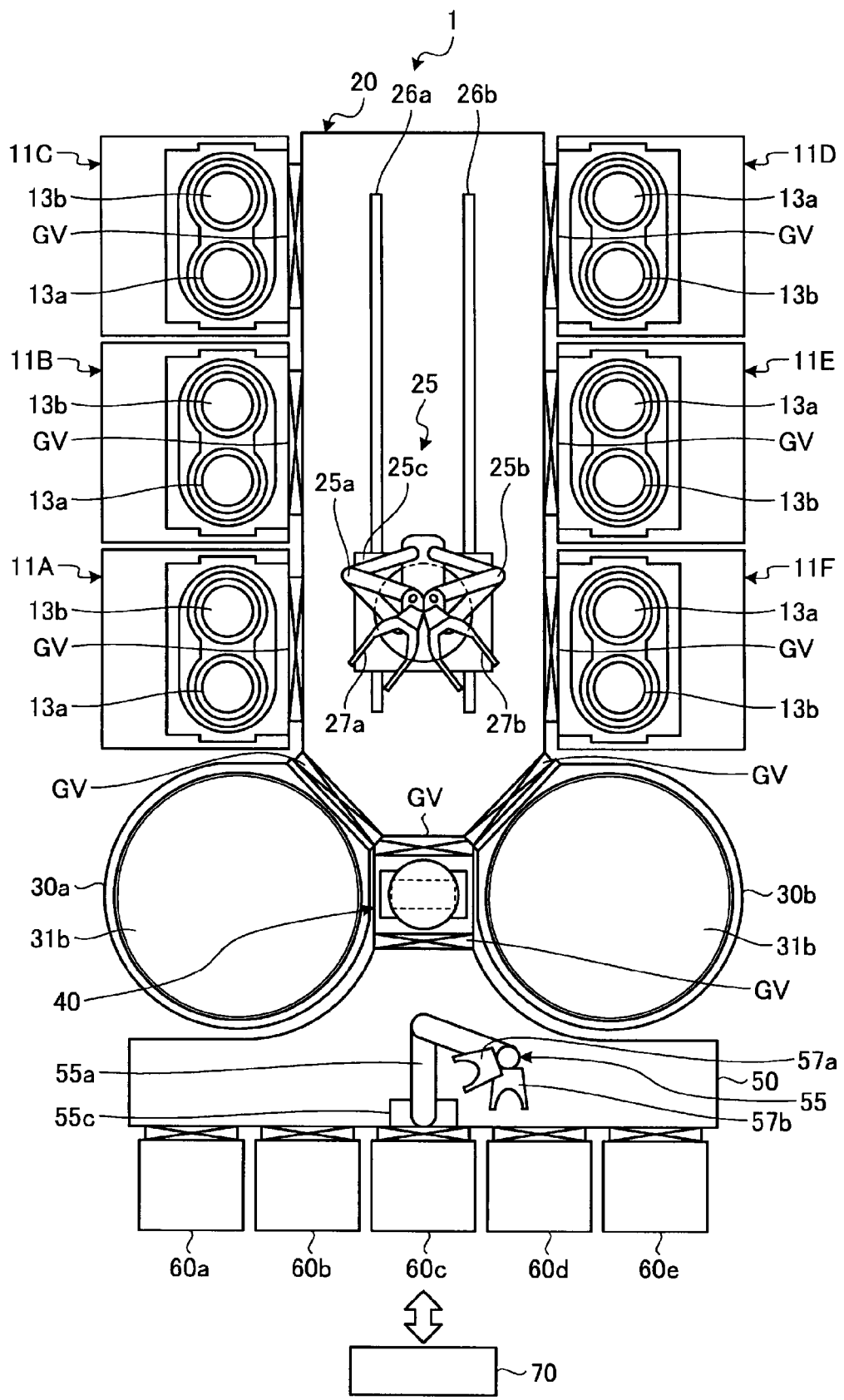
FIG. 1 is a schematic view illustrating configuration of a substrate processing system including a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various embodiments will be described in detail with reference to the drawings. In each of the drawings, the same or corresponding parts will be denoted by the same reference numerals.

When a heating chamber and a cooling chamber are provided separately, it takes time to transfer a substrate between the heating chamber and the cooling chamber. Thus, there is a concern that a throughput of a substrate processing system may deteriorate. Therefore, it is expected that a heating process and a cooling process are performed on a substrate in a single chamber of a substrate processing system.

(Exemplary Configuration of Substrate Processing System Including Substrate Processing Apparatus According to Embodiment)

A substrate processing system includes a vacuum processing chamber configured to perform a vacuum process on a substrate and a substrate processing apparatus configured to perform a heating process and a cooling process on the substrate, and repeatedly performs a process cycle including the vacuum process, the heating process, and the cooling process on the substrate by transferring the substrate between the vacuum processing chamber and the substrate processing apparatus. A substrate processing apparatus according to an embodiment has a chamber, which includes a substrate-heating region and a substrate-cooling region, and heats a substrate in the substrate-heating region and cools another substrate in the substrate-cooling region while the substrate is heated in the substrate-heating region. In an embodiment, the substrate-heating region and the substrate-cooling region are separated in terms of heat and pressure by a partition.

Here, the term "vacuum process" refers to, for example, an etching process such as a chemical oxide removal (COR)

process or a film forming process. Hereinafter, embodiments will be described using a COR process as an example of the vacuum process. In the following description, "vacuum" refers to a state filled with a gas having a pressure lower than atmospheric pressure. That is, in the following description, "vacuum" includes a reduced-pressure state or a negative-pressure state. In the following description, "normal pressure" indicates a pressure substantially equal to the atmospheric pressure.

FIG. 1 is a schematic view illustrating configuration of a substrate processing system 1 including a substrate processing apparatus 30 according to an embodiment.

The substrate processing system 1 includes a plurality of COR chambers 11 (11A to 11F), a vacuum transfer chamber 20, a plurality of substrate processing apparatuses 30 (30a and 30b), a load-lock chamber 40, and a normal-pressure transfer chamber 50. In addition, the substrate processing system 1 has a plurality of load ports 60 (60a to 60e) and a control device 70.

In the example of FIG. 1, six COR chambers 11A to 11F, two substrate processing apparatuses 30a and 30b, and five load ports 60a to 60e are illustrated. However, the numbers of the COR chambers 11, the substrate processing apparatuses 30, and the load ports 60 included in the substrate processing system 1 are not limited to those illustrated in FIG. 1. Hereinafter, the six COR chambers 11A to 11F are collectively referred to as the COR chamber 11 unless it is necessary to distinguish the COR chambers from one another. Similarly, the two substrate processing apparatuses 30a and 30b are collectively referred to as the substrate processing apparatus 30. Similarly, the five load ports 60a to 60e are collectively referred to as the load port 60.

The COR chamber 11 performs a COR process on a semiconductor substrate (hereinafter, referred to as a "wafer") W as a processing target in a reduced-pressure atmosphere. The COR chamber 11 has stages 13a and 13b on which two wafers W are placed side by side in a horizontal direction. The COR chamber 11 simultaneously performs a COR process on the two wafers W placed on the stages 13a and 13b.

Each of the COR chambers 11 is connected to the vacuum transfer chamber 20 via a gate valve GV capable of being opened and closed. The gate valve GV is closed while the COR process of the wafer W is being performed in the COR chamber 11. The gate valve GV is opened when the wafer W is unloaded from the COR chamber 11 and when the wafer W is loaded into the COR chamber 11. The COR chamber 11 is provided with a gas supply for supplying a processing gas and a gas exhauster for discharging the gas.

The interior of the vacuum transfer chamber 20 is capable of being maintained at a reduced-pressure atmosphere. The wafer W is transferred to each COR chamber 11 and each substrate processing apparatus 30 via the vacuum transfer chamber 20. In the example of FIG. 1, the vacuum transfer chamber 20 has a substantially hexagonal shape in a plan view, and the COR chambers 11 are arranged along two opposite sides of the vacuum transfer chamber 20. The wafer W that has been subjected to the COR process in the COR chamber 11 is transferred to the substrate processing apparatus 30 via the vacuum transfer chamber 20. The wafer W that has been subjected to the heating process and the cooling process in the substrate processing apparatus 30 is transferred to the COR chamber 11 where a subsequent COR process is performed via the vacuum transfer chamber 20. The wafer W on which all the processes have been completed is transferred to the load-lock chamber 40 via the vacuum transfer chamber 20. The vacuum transfer chamber 20 has a gas supply (not illustrated) and a gas exhauster configured to vacuum-evacuate the vacuum transfer chamber 20.

In the vacuum transfer chamber 20, a vacuum transfer module (VTM) arm 25 for transferring the wafer W is disposed. The VTM arm 25 transfers the wafer W among the COR chambers 11A to 11F, the substrate processing apparatuses 30a to 30b, and the load lock chamber 40.

The VTM arm 25 illustrated in FIG. 1 has a first arm 25a and a second arm 25b. The first arm 25a and the second arm 25b are mounted on a base 25c. The base 25c is slidable in a longitudinal direction of the vacuum transfer chamber 20 along guide rails 26a and 26b. For example, the base 25c moves in the vacuum transfer chamber 20 by motor driving of screws screw-coupled to the guide rails 26a and 26b. The first arm 25a and the second arm 25b are pivotally fixed on the base 25c. In addition, substantially U-shaped first and second picks 27a and 27b are rotatably connected to tip ends of the first and second arms 25a and 25b, respectively. In addition, each of the first pick 27a and the second pick 27b may have a holder that is arranged to overlap one another in the vertical direction.

The VTM arm 25 has motors (not illustrated) for expanding and contracting the first arm 25a and the second arm 25b, respectively.

The substrate processing apparatus 30 simultaneously performs the heating process and the cooling process on at least two wafers W in a reduced-pressure atmosphere. The substrate processing apparatus 30 has a chamber including a substrate-heating region and a substrate-cooling region. A plurality of wafers W that have been subjected to the COR process in the plurality of COR chambers 11 are sequentially transferred to chambers of the substrate processing apparatuses 30 via the vacuum transfer chamber 20. The substrate processing apparatus 30 heats a first wafer, which is at least one of the plurality of wafers W, in the substrate-heating region, and cools a second wafer, which is at least another one of the plurality of wafers W, in the substrate-cooling region while the first wafer is being heated. In the substrate processing apparatus 30, the substrate-heating region and the substrate-cooling region are separated from each other in terms of heat and pressure by a partition. Thus, it is possible to suppress heat conduction between the substrate-heating region and the substrate-cooling region, and to individually control a pressure in the substrate-heating region and a pressure in the substrate-cooling region. Each substrate processing apparatus 30 is connected to the vacuum transfer chamber 20 via a gate valve GV. Details of the substrate processing apparatus 30 will be described later.

The load-lock chamber 40 has a stocker capable of holding a plurality of wafers W. The load-lock chamber 40 has an exhaust mechanism (not illustrated) (e.g., a vacuum pump and a leak valve), and is configured to switch the interior of the load lock chamber 40 between an atmospheric atmosphere and a reduced-pressure atmosphere. The load-lock chamber 40 is arranged on one side of the vacuum transfer chamber 20 where the COR chambers 11 and the substrate processing apparatuses 30 are not arranged. The load-lock chamber 40 and the vacuum transfer chamber 20 are configured to be in communication with each other via the gate valve GV.

The VTM arm 25 takes out the wafer W from the stocker in the load-lock chamber 40 and transfers the wafer W to the stage 13a or 13b in the COR chamber 11. In addition, the VTM arm 25 takes out the wafer W, on which all the processes have been completed, from the substrate processing apparatus 30 and transfers the wafer W to the stocker in the load-lock chamber 40.

The load-lock chamber 40 is connected to the normal-pressure transfer chamber 50 at a side opposite a side connected to the vacuum transfer chamber 20. The interiors of the load-lock chamber 40 and the normal-pressure transfer chamber 50 are configured to be in communication with each other via a gate valve GV.

The normal-pressure transfer chamber 50 is maintained at a normal-pressure atmosphere. In the example of FIG. 1, the normal-pressure transfer chamber 50 has a substantially trapezoidal shape having an upper side shorter than a lower side in a plan view. The load-lock chamber 40 is arranged on the upper side of the normal-pressure transfer chamber 50, and the load ports 60 are arranged in parallel on the lower side of the normal-pressure transfer chamber 50. A loader module (LM) arm 55 for transferring an object to be transferred between the load-lock chamber 40 and the load ports 60 is disposed in the normal-pressure transfer chamber 50. The LM arm 55 has an arm 55a, which is rotatably fixed on a base 55c. The base 55c is installed to be movable along a wall surface of the normal-pressure transfer chamber 50 on the load port 60 side. Substantially U-shaped first and second picks 57a and 57b are rotatably connected to a tip end of the arm 55a.

Each load port 60 is formed to be capable of loading a front opening unify pod (FOUP) for accommodating a plurality of wafers W. The FOUP is a container capable of accommodating therein a plurality of wafers W.

The COR chambers 11, the vacuum transfer chamber 20, the VTM arm 25, the substrate processing apparatuses 30, the load-lock chamber 40, the normal-pressure transfer chamber 50, the LM arm 55, and the load ports 60 are individually connected to the control device 70 so as to be controlled by the control device 70.

The control device 70 is an information processing device that controls operation of individual components of the substrate processing system 1. The control device 70 has a storage, a processor, and the like. The storage is an arbitrary storage device such as a hard disk, an optical disk, and a semiconductor memory device. The processor is, for example, a processor such as a central processing unit (CPU) and a micro processing unit (MPU). The processor controls individual components of the substrate processing system 1 by reading and executing a program or a recipe stored in the storage.

(Exemplary Configuration of Substrate Processing Apparatus 30)

Figure 2:
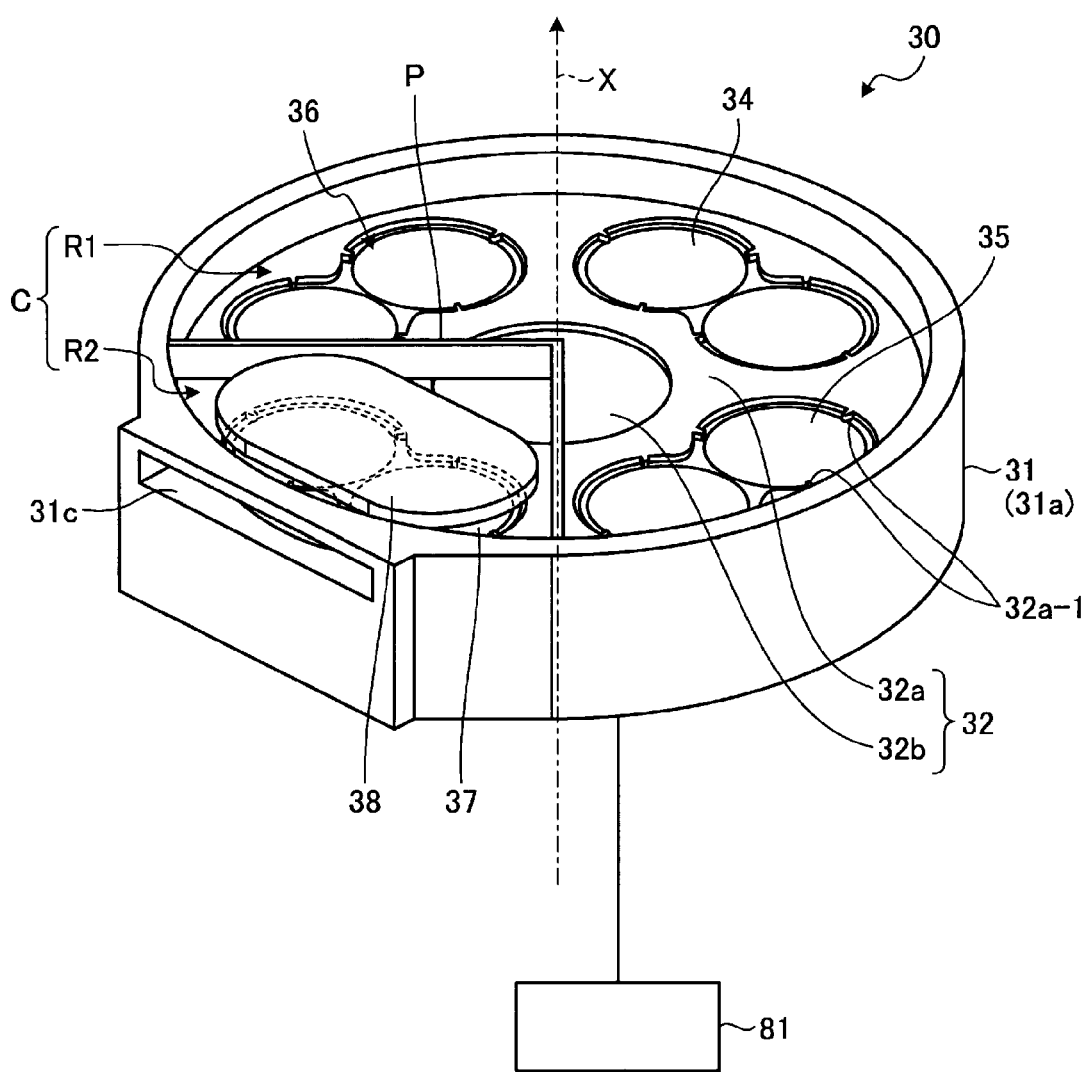
FIG. 2 is a perspective view illustrating an example of a substrate processing apparatus according to an embodiment.
Figure 3:
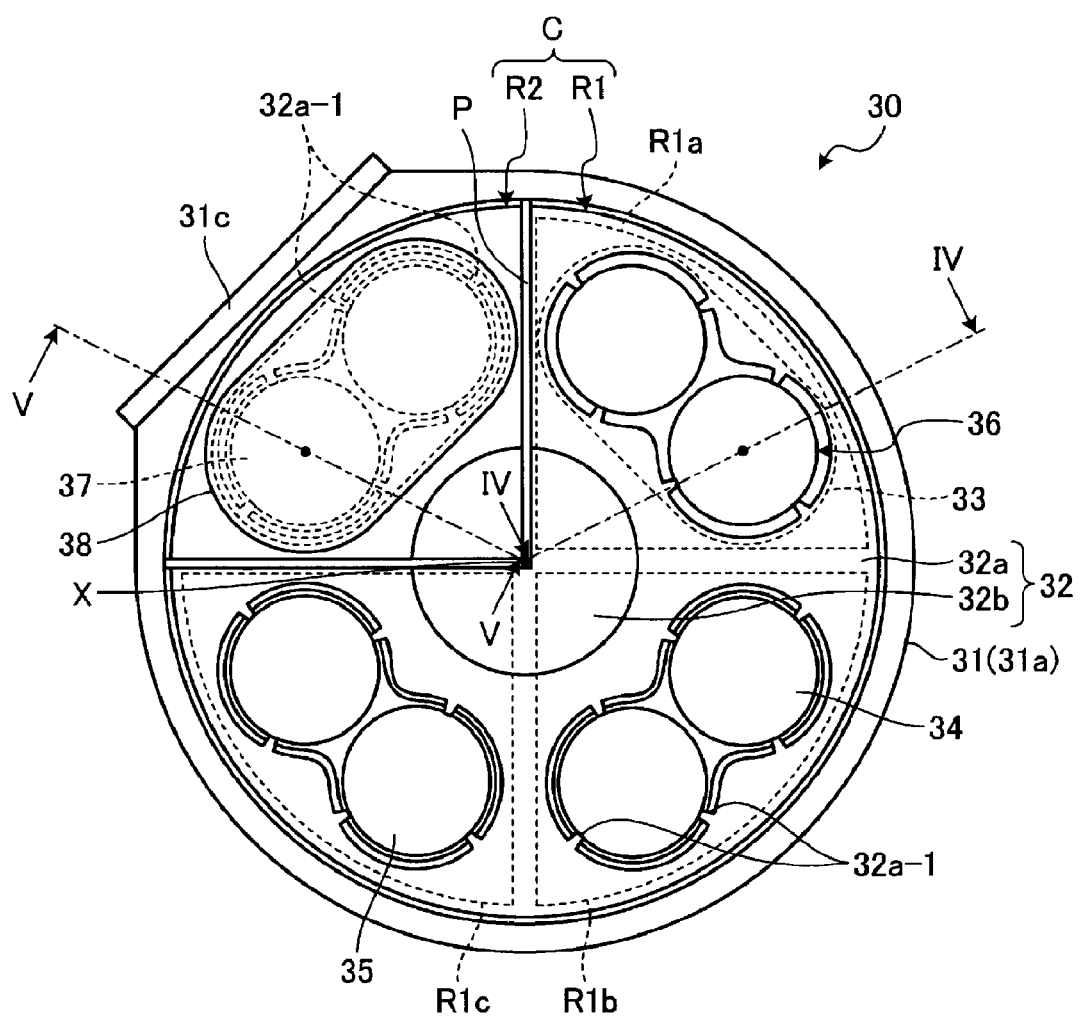
FIG. 3 is a plan view illustrating an example of a substrate processing apparatus when viewed from above.

FIG. 2 is a perspective view illustrating an example of the substrate processing apparatus 30 according to an embodiment. FIG. 3 is a plan view illustrating an example of the substrate processing apparatus 30 when viewed from above. In FIGS. 2 and 3, an upper member 31b (see FIG. 1) of the substrate processing apparatus 30 is omitted for convenience of description. The substrate processing apparatus 30 illustrated in FIGS. 2 and 3 mainly includes a chamber 31, a transfer mechanism 32, a partition P, and a controller 81.

The chamber 31 has a lower member 31a and the upper member 31b (see FIG. 1). The lower member 31a has a substantially cylindrical shape having an open top, and forms a concave portion including a side wall and a bottom wall forming a processing container C. The upper member 31b is a substantially disk-shaped lid, and forms the processing container C by closing the open top of the lower member 31a. A sealing member such as an O-ring or the like for sealing the processing container C is provided at an outer peripheral portion between the lower member 31a and the upper member 31b. The chamber 31 has a substrate transfer port 31c for delivering the wafer W to and from the VTM arm 25 in the side wall of the lower member 31a. The substrate transfer port 31c is provided with the gate valve GV (see FIG. 1). When loading and unloading of the wafer W is performed, the gate valve GV is opened. Then, the wafer W is loaded and unloaded through the substrate transfer port 31c by the VTM arm 25.

As illustrated in FIG. 3, the processing container C includes, for example, a first region R1 and a second region R2 arranged on a circumference centered on an axis X. The first region R1 is an example of a substrate-heating region, and the second region R2 is an example of a substrate-cooling region. Each of the first region R1 and the second region R2 is provided with a gas supply pipe (not illustrated) for supplying a pressurizing gas such as $N_2$ gas. The first region R1 is divided into a first division region R1a, a second division region R1b, and a third division region R1c. The first division region R1a, the second division region R1b, and the third division region R1c are in communication with one another in terms of heat and pressure.

In the example of FIGS. 2 and 3, one first region R1 and one second region R2 are illustrated. However, the numbers of the first and second regions R1 and R2 included in the processing container C are not limited to those illustrated in FIGS. 2 and 3. In addition, the number of division regions (the first division region R1a, the second division region R1b, and the third division region R1c) included in the first region R1 is not limited to those illustrated in FIGS. 2 and 3.

Heating mechanisms for heating the wafer W are disposed in the first region R1. A temperature-raising mechanism 33 and heat-insulating mechanisms 34 and 35 illustrated in FIG. 3 are examples of the heating mechanisms. The temperature-raising mechanism 33 raises a temperature of the wafer W in the first division region R1a to a sublimation temperature. The sublimation temperature is, for example, a temperature at which a reaction product generated by a COR process evaporates. The temperature-raising mechanism 33 is disposed, for example, in a portion corresponding to the first division region R1a in the upper member 31b (see FIG. 1), and raises the temperature of the wafer W from a side of the upper member 31b in a state in which rotation of a rotary table 32a to be described later is stopped. In FIG. 3, since the upper member 31b is omitted, the arrangement position of the temperature-raising mechanism 33 is indicated by a broken line. In addition, a position alignment mechanism 36 for performing a position alignment of the wafer W is disposed in the first division region R1a. The first division region R1a is an example of a substrate temperature-raising region. Details of the first division region R1a of the first region R1 will be described later.

The heat-insulating mechanisms 34 and 35 maintain the wafer W in the second division region R1b and the third division region R1c at the sublimation temperature, respectively. Each of the heat-insulating mechanisms 34 and 35 is, for example, a stage configured to move upward and downward by a driving mechanism (not illustrated) and having a heater therein. Each of the heat-insulating mechanisms 34 and 35 is disposed below the rotary table 32a to be described later. When the rotation of the rotary table 32a is stopped, each of the heat-insulating mechanisms 34 and 35 moves upward from below the rotary table 32a and is brought into contact with the wafer W through a hole in the rotary table 32a. Then, each of the heat-insulating mechanisms 34 and 35 heats the wafer W by the heater therein. Thus, each of the heat-insulating mechanisms 34 and 35 maintains the wafer W at the sublimation temperature. The second division region R1b and the third division region R1c are examples of a substrate heat-insulating region. The heater disposed inside each of the heat-insulating mechanisms 34 and 35 is an example of a resistance heating element. Each of the heat-insulating mechanisms 34 and 35 may be configured to include at least one of the resistance heating element, a radiation source (e.g., a light-emitting diode (LED) heater) that emits light having a specific wavelength, and a heating gas supply element (e.g., a $N_2$ gas supply pipe).

A cooling mechanism for cooling the wafer W is disposed in the second region R2. A cooling plate 37 illustrated in FIG. 3 is an example of the cooling mechanism. The cooling plate 37 is provided so as to move upward and downward in the second region R2, and has a coolant flow path therein. The cooling plate 37 is disposed below the rotary table 32a to be described later. When the rotation of the rotary table 32a is stopped, the cooling plate 37 moves upward from below the rotary table 32a and is brought into contact with the wafer W through a hole in the rotary table 32a. Then, the cooling plate 37 cools the wafer W by a coolant flowing through the coolant flow path. In addition, a sealer 38 for sealing the wafer W when the wafer W is cooled is disposed in the second region R2. Details of the second region R2 will be described later.

The substrate processing apparatus 30 has the transfer mechanism 32 in the processing container C formed inside the chamber 31, for example, as illustrated in FIGS. 2 and 3. The transfer mechanism 32 transfers the wafer W between the first region R1 and the second region R2. The transfer mechanism 32 includes the rotary table 32a and a rotary mechanism 32b.

The rotary table 32a is a substantially disk-shaped member having the axis X as a central axis, and has a plurality of holes (four holes in the example of FIG. 3) arranged at predetermined intervals in a circumferential direction. Flanges 32a-1 for holding the wafer W is formed in each of the plurality of holes in the rotary table 32a. The rotary table 32a holds a plurality of wafers W sequentially transferred from the substrate transfer port 31c in the plurality of holes by the flanges 32a-1, respectively. The rotary table 32a is configured to hold, in each of the plurality of holes, a number of wafers W corresponding to the number of wafers W simultaneously subjected to the COR process in the COR chamber 11. For example, when the number of wafers W simultaneously subjected to the COR process in one COR chamber 11 is two, it is necessary for the rotary table 32a to hold two wafers W in each of the plurality of holes. The rotary table 32a is an example of a holder.

The rotary mechanism 32b rotates the rotary table 32a about the axis X. The wafer W held on the rotary table 32a moves around the axis X with the rotation of the rotary table 32a, and sequentially passes through the first region R1 and the second region R2. In the present embodiment, the rotary table 32a rotates, for example, clockwise when viewed from above. In addition, each time the wafer W held on the rotary table 32a reaches each of the first division region R1a, the second division region Rib, the third division region R1c of the first region R1, and the second region R2, the rotary mechanism 32b temporarily stops the rotation of the rotary table 32a.

As illustrated in FIGS. 2 and 3, for example, the substrate processing apparatus 30 includes the partition P for separating, in terms of heat and pressure, the first region R1 and the second region R2 in the processing container C formed in the chamber 31. The partition P has a substantially V-shape with a corner located on the axis X when viewed from above, and is fixed to the side wall of the lower member 31a. The partition P may be located at any position at which the partition P does not interfere with the rotary table 32a and the wafers W held on the rotary table 32a when the rotary table 32a rotates. In the bottom portion of the processing container C, another partition (not illustrated) is provided correspondingly to the position where the partition P is provided. Similarly to the partition P, the other partition has a function of separating the first region R1 and the second region R2 in terms of heat and pressure. The other partition has substantially the same shape as the partition P, and is fixed to the side wall of the lower member 31a. The other partition may be located at any position at which the partition does not interfere with the rotary table 32a and the wafers W held on the rotary table 32a when the rotary table 32a rotates. That is, the other partition is disposed such that a gap, through which the rotary table 32a and the wafers W held on the rotary table 32a can pass, is formed between the other partition and the partition P.

The controller 81 is an information processing device that controls individual components of the substrate processing apparatus 30. The controller 81 has a storage, a processor, and the like. The storage is an arbitrary storage device such as a hard disk, an optical disk, and a semiconductor memory device. The processor is, for example, a processor such as a CPU or an MPU. The controller 81 controls individual components of the substrate processing apparatus 30 by causing the processor to operate according to a control program stored in the storage. The controller 81 and the control device 70 of the substrate processing system 1 may communicate with each other so as to control individual components of the substrate processing apparatus 30.

For example, as will be described later, the controller 81 causes the heating mechanism and the cooling mechanism to execute a heating process of a wafer W in the first region R1 and a cooling process of another wafer W in the second region R2 in parallel. In this case, since the first region R1 and the second region R2 are thermally separated from each other by the partition P, it is possible to individually improve heating efficiency in the first region R1 and cooling efficiency in the second region R2. In addition, since the first region R1 and the second region R2 are also separated from each other in terms of pressure by the partition P, it is possible to independently control the pressure in the first region R1 and the pressure in the second region R2. In the present example, by setting the pressure of the second region R2 during the cooling process to be higher than the pressure of the first region R1 during the heating process, it is possible to prevent a gas sublimated in the first region R1 from entering the second region R2. Thus, it is possible to prevent the gas sublimated in the first region R1 from adhering to a substrate in the second region R2.

(Example of First Division Region R1a of First Region R1)

Figure 4:
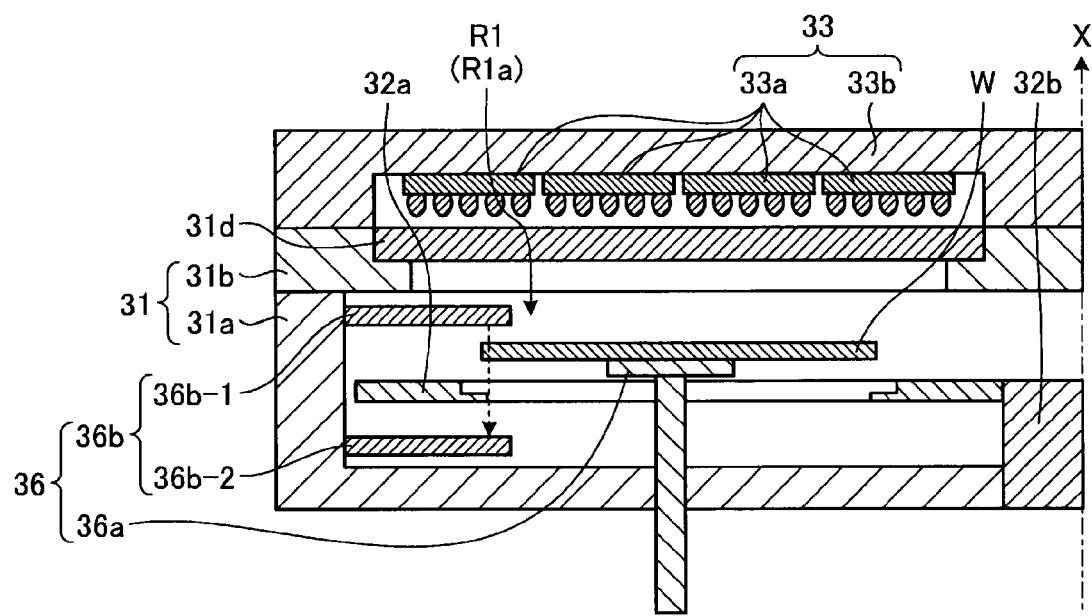
FIG. 4 is a schematic cross-sectional view illustrating an example of a first division region of a first region included in a chamber.

Next, an example of the first division region R1a of the first region R1 included in the chamber 31 will be described. FIG. 4 is a schematic cross-sectional view illustrating an example of the first division region R1a of the first region R1 included in the chamber 31. FIG. 4 corresponds to a cross section taken along line IV-IV in FIG. 3. As illustrated in FIG. 4, the temperature-raising mechanism 33 is disposed in a portion of the upper member 31b of the chamber 31 corresponding to the first division region R1a. The temperature-raising mechanism 33 raises the temperature of the wafer W to the sublimation temperature from the side of the upper member 31b in the state in which the rotation of the rotary table 32a is stopped. The temperature-raising mechanism 33 has LED heaters 33a and a fixer 33b that fixes the LED heaters 33a to the upper member 31b. The LED heaters 33a emit light having a specific wavelength. The light having the specific wavelength is, for example, infrared light. The light emitted from the LED heaters 33a passes through a transmission window 31d provided in the upper member 31b, and thus the wafer W is irradiated with the light in the first division region R1a. Thus, the temperature of the wafer W is raised to the sublimation temperature. The LED heaters 33a are an example of a radiation source.

In addition, the position alignment mechanism 36 for performing the position alignment of the wafer W is disposed in the first division region R1a. The position alignment mechanism 36 has a rotary stage 36a on which the wafer W is placed, and a detection unit 36b configured to optically detect the outer peripheral edge of the wafer W. The rotary stage 36a operates so as to be movable upward and downward by a driving mechanism (not illustrated) and to be rotatable about a vertical axis. The rotary stage 36a is disposed below the rotary table 32a. When the rotation of the rotary table 32a is stopped, the rotary stage 36a moves upward from below the rotary table 32a and passes through the hole in the rotary table 32a, thereby lifting the wafer W. FIG. 4 illustrates a state in which the rotary stage 36a has been raised. In the state in which the rotary stage 36a has been raised, the wafer W is in a state in which the wafer W has been raised by the rotary stage 36a and becomes rotatable with a rotation of the rotary stage 36a. The detection unit 36b has a light emitter 36b-1 and a light receiver 36b-2 provided at positions where the wafer W held on the rotary table 32a is interposed therebetween. When the light emitted from the light emitter 36b-1 is incident on the light receiver 36b-2, the intensity of the incident light is detected by the light receiver 36b-2, and the detection result is output to the controller 81. The controller 81 detects an orientation flat or notch at the outer peripheral edge of the wafer W based on the intensity of light detected by the light receiver 36b-2. Then, the controller 81 performs a position alignment of the wafer W by controlling the rotary stage 36a so that the detected orientation flat or notch faces in a predetermined direction. Further, the position alignment of the wafer W may be performed in parallel with the temperature-raising of the wafer W in the first division region R1a. Therefore, it is possible to improve in-plane temperature uniformity of the wafer W.

(Example of Second Region R2)

Figure 5:
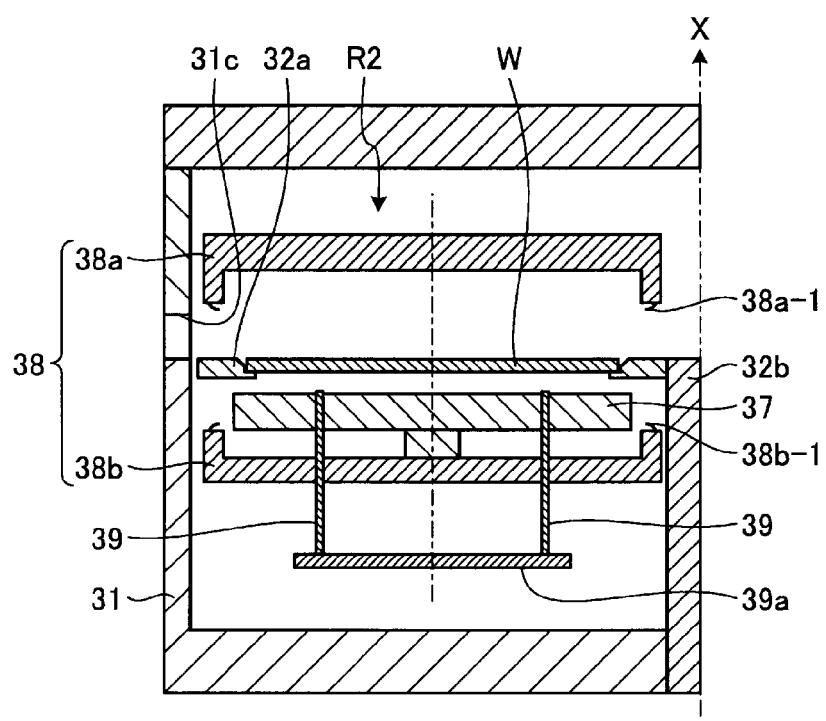
FIG. 5 is a schematic cross-sectional view illustrating an example of a second region included in the chamber.
Figure 6:
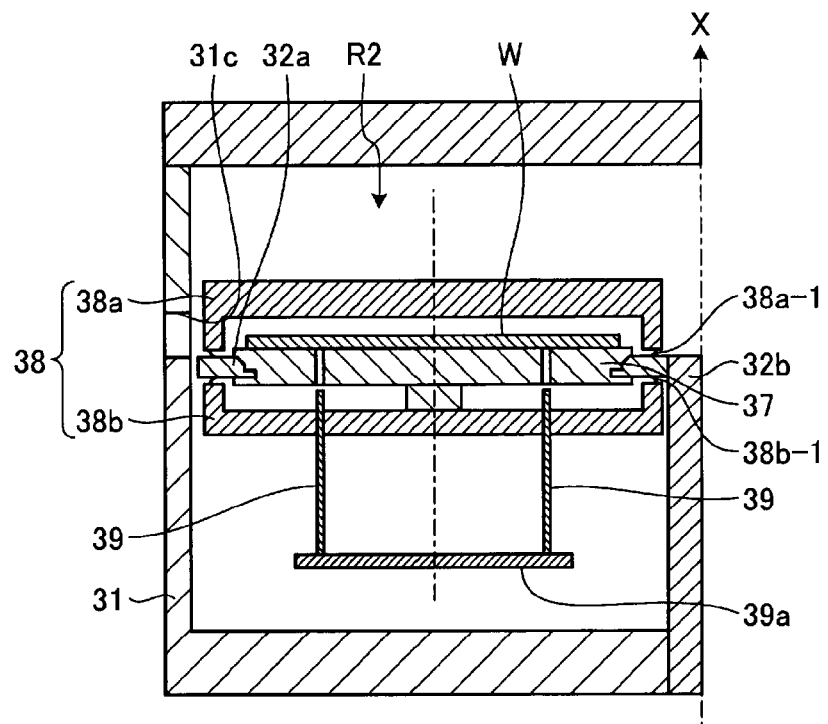
FIG. 6 is a schematic cross-sectional view illustrating an example of a second region included in the chamber.

Next, an example of the second region R2 included in the chamber 31 will be described. FIGS. 5 and 6 are schematic cross-sectional views illustrating an example of the second region R2 included in the chamber 31. FIG. 5 corresponds to a cross section taken along line V-V in FIG. 3. As illustrated in FIGS. 5 and 6, the cooling plate 37 for cooling the wafer W and the sealer 38 for sealing the wafer W when the wafer W is cooled are disposed in the second region R2 of the chamber 31.

The cooling plate 37 has the coolant flow path therein. The coolant flow path in the cooling plate 37 is connected to a chiller unit provided outside the chamber 31 or a general cooling water facility via a pipe, and the coolant is supplied to and circulates in the coolant flow path. The cooling plate 37 is fixed to the sealer 38 (a lower movable member 38b to be described later), and moves upward and downward in the second region R2 as the lower movable member 38b moves upward and downward. The cooling plate 37 has a size capable of passing through the hole of the rotary table 32a, and notches for avoiding interference with the flanges 32a-1 formed in the hole in the rotary table 32a are formed on the outer periphery of the cooling plate 37. The cooling plate 37 is disposed below the rotary table 32a. When the rotation of the rotary table 32a is stopped, the cooling plate 37 moves upward from below the rotary table 32a and is brought into contact with the wafer W in the hole in the rotary table 32a. FIG. 5 illustrates a state in which the cooling plate 37 has been lowered, and FIG. 6 illustrates a state in the cooling plate 37 has been raised. As illustrated in FIG. 6, in the state in which the cooling plate 37 has been raised, the wafer W is in a state in which the wafer W has been placed on the cooling plate 37. Then, the cooling plate 37 cools the wafer W by the coolant flowing through the coolant flow path.

The sealer 38 has an upper movable member 38a and the lower movable member 38b. The upper movable member 38a and the lower movable member 38b are each formed in a cylindrical shape having a bottom, and are arranged at positions at which the wafer W held on the rotary table 32a is interposed therebetween. The upper movable member 38a and the lower movable member 38b are configured to move vertically by a driving mechanism (not illustrated). The cooling plate 37 is fixed to the lower movable member 38b. When the wafer W is cooled by the cooling plate 37 (that is, when the rotation of the rotary table 32a is stopped), the upper movable member 38a and the lower movable member 38b approach each other and seal the wafer W. On the other hand, when the transfer mechanism 32 transfers the wafer W (that is, when the rotary table 32a rotates), the upper movable member 38a and the lower movable member 38b are separated from each other so as to release the seal. FIG. 5 illustrates a state in which the upper movable member 38a and the lower movable member 38b have been separated from each other, and FIG. 6 illustrates a state in which the upper movable member 38a and the lower movable member 38b have approached each other.

The upper movable member 38a and the lower movable member 38b have seal members 38a-1 and 38b-1 on end faces facing the rotary table 32a, respectively. When the wafer W is cooled by the cooling plate 37, the upper movable member 38a and the lower movable member 38b approach each other, and hermetically seals the wafer W by bringing the sealing members 38a-1 and 38b-1 into contact with the rotary table 32a. The upper movable member 38a is an example of a first movable member, and the lower movable member 38b is an example of a second movable member.

Further, in the present example, a pressurizing gas is supplied to a sealed space formed between the upper movable member 38a and the lower movable member 38b to accommodate the wafer W therein so as to increase a pressure in the sealed space when the wafer W is cooled by the cooling plate 37. For example, the upper movable member 38a or the lower movable member 38b may be provided with a gas supply pipe for supplying the pressurizing gas, such as $N_2$ gas, to the sealed space between the upper movable member 38a and the lower movable member 38b. The cooling plate 37 cools the wafer W in a state in which the pressure in the sealed space between the upper movable member 38a and the lower movable member 38b is increased by the pressurizing gas. Thus, it is possible to improve the cooling efficiency of the wafer W. In addition, when the pressure in the sealed space inside the sealer 38 is increased by the pressurizing gas, the following relationship is established: the pressure inside the sealer 38 the pressure outside the sealer 38>the pressure in the first region R1. Thus, it is possible to prevent deposits from entering the sealed space inside the sealer 38, and to keep the sealed space inside the sealer 38 in a clean state.

Figure 7:
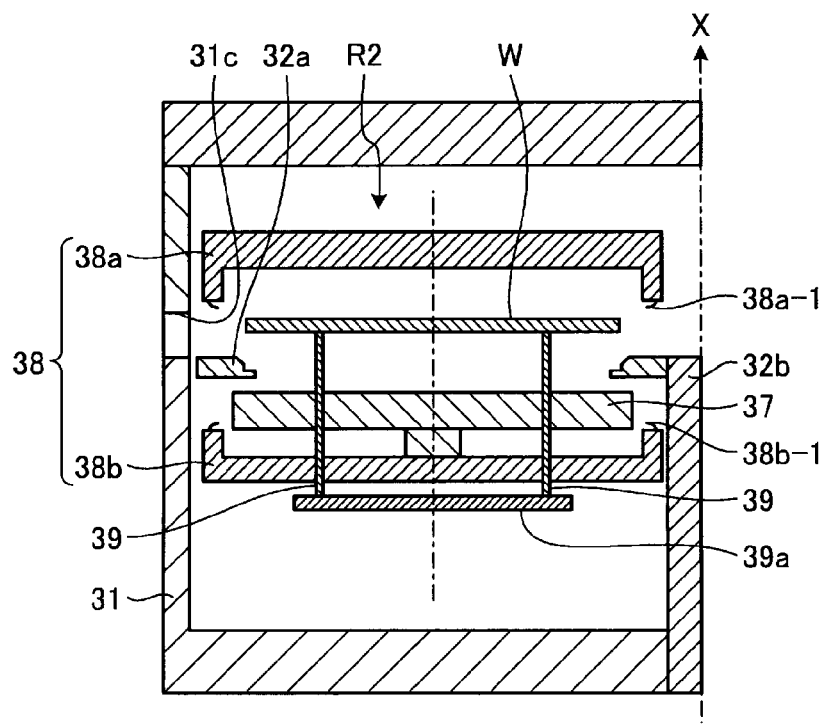
FIG. 7 is a view illustrating an example of a state in which a wafer has been raised from a rotary table by lifting pins.

Further, the substrate transfer port 31c is disposed in the second region R2. In addition, lifting pins 39 configured to move upward and downward from the upper surface of the cooling plate 37 are provided in the second region R. The lifting pins 39 are disposed on, for example, an annular base 39a, and are driven by a driving mechanism (not illustrated) connected to the base 39a. The lifting pins 39 are inserted into holes formed through the lower movable member 38b and holes formed through the cooling plate 37, and are moved upward and downward from the upper surface of the cooling plate 37 under a drive control of the driving mechanism via the base 39a. When the rotation of the rotary table 32a is stopped, the lifting pins 39 configured as described above can move upward from the upper surface of the cooling plate 37 as illustrated in FIG. 7 under the drive control of the driving mechanism via the base 39a, thereby raising the wafer W from the rotary table 32a. FIG. 7 is a view illustrating an example of a state in which the wafer W has been raised from the rotary table 32a by the lifting pins 39. The wafer W raised from the rotary table 32a by the lifting pins 39 is taken out from the substrate transfer port 31c by the VTM arm 25 (see FIG. 1).

(Processing Operation of Substrate Processing Apparatus 30 According to Embodiment)

FIGS. 8 to 12 are views for explaining an example of processing operation of the substrate processing apparatus 30 according to an embodiment. When the plurality of wafers W subjected to the COR process in the plurality of COR chambers 11 are sequentially transferred to the chamber 31 by the VTM arm 25, the substrate processing apparatus 30 continuously performs the heating process and the cooling process on the plurality of wafers W. In an embodiment, the substrate processing apparatus 30 heats a first wafer, which is at least one of the plurality of wafers W, in the substrate-heating region, and cools a second wafer, which is at least another one of the plurality of wafers W, in the substrate-cooling region while the first wafer is being heated. In the following description, it is assumed that two wafers #1 and #2 that have been subjected to the COR process correspond to the second wafer, and two wafers #3 and #4 that have been subjected to the COR process correspond to the first wafer.

Figure 8:
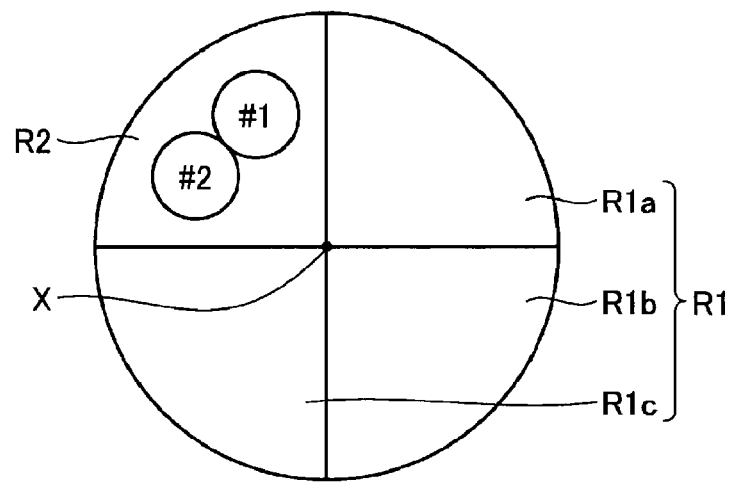
FIG. 8 is a view for explaining an example of a processing operation of a substrate processing apparatus according to an embodiment.

For example, first, as illustrated in FIG. 8, when two wafers #1 and #2 subjected to the COR process are loaded into the second region R2 in the chamber 31 by the VTM arm 25, the substrate processing apparatus 30 operates the lifting pins 39 so as to hold the wafers #1 and #2 on the rotary table 32a. Then, the substrate processing apparatus 30 operates the rotary mechanism 32b to rotate the rotary table 32a about the axis X.

Figure 9:
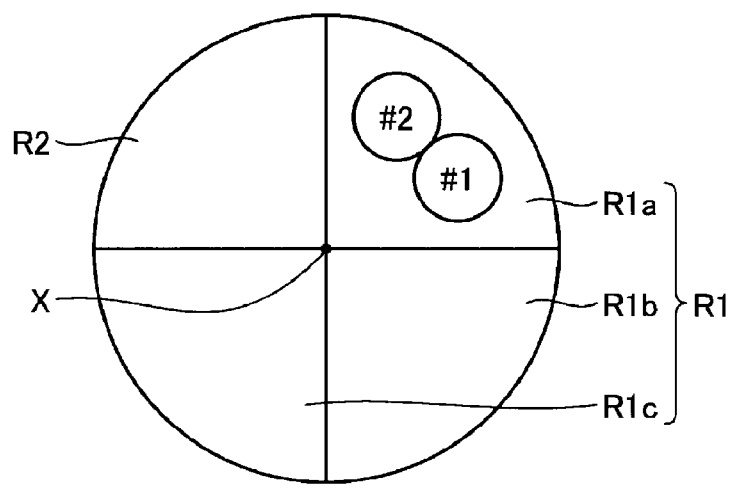
FIG. 9 is a view for explaining an example of a processing operation of a substrate processing apparatus according to an embodiment.

The wafers #1 and #2 held on the rotary table 32a move clockwise around the axis X with the rotation of the rotary table 32a, and reaches the first division region R1a of the first region R1, as illustrated in FIG. 9. When the wafers #1 and #2 held on the rotary table 32a reach the first division region R1a, the substrate processing apparatus 30 stops the rotary mechanism 32b so as to stop the rotation of the rotary table 32a. Then, the substrate processing apparatus 30 operates the temperature-raising mechanism 33 disposed in the first division region R1a so as to raise the temperature of the wafers #1 and #2 in the first division region R1a to the sublimation temperature. As a result, reaction products generated by the COR process are vaporized from the wafers #1 and #2. When a predetermined time elapses after the operation of the temperature-raising mechanism 33 is initiated, the substrate processing apparatus 30 operates the rotary mechanism 32b to rotate the rotary table 32a about the axis X.

Figure 10:
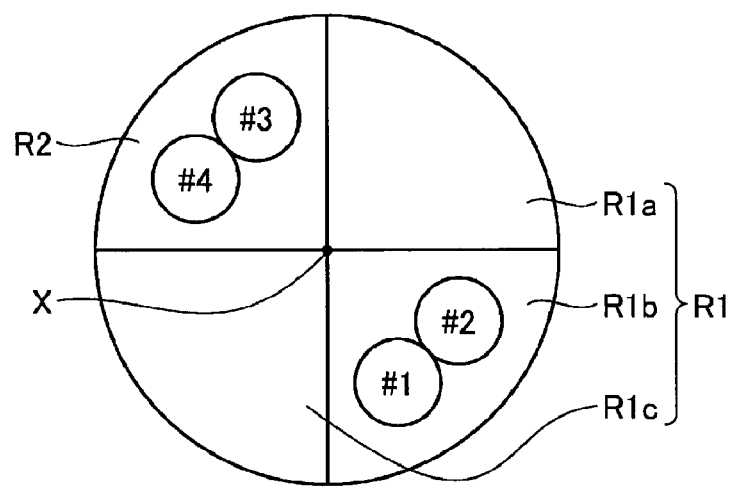
FIG. 10 is a view for explaining an example of a processing operation of a substrate processing apparatus according to an embodiment.

The wafers #1 and #2 held on the rotary table 32a move clockwise around the axis X with the rotation of the rotary table 32a, and reaches the second division region R1b of the first region R1, as illustrated in FIG. 10. When the wafers #1 and #2 held on the rotary table 32a reach the second division region Rib, the substrate processing apparatus 30 stops the rotary mechanism 32b and stops the rotation of the rotary table 32a. Then, the substrate processing apparatus 30 operates the heat-insulating mechanism 34 disposed in the second division region R1b so as to maintain the wafers #1 and #2 in the second division region R1b at the sublimation temperature. As a result, the reaction products generated by the COR process are continuously vaporized from the wafers #1 and #2. Meanwhile, as illustrated in FIG. 10, when the two wafers #3 and #4 subjected to the COR process are loaded into the second region R2 in the chamber 31 by the VTM arm 25, the substrate processing apparatus 30 operates the lifting pins 39 so as to hold the wafers #3 and #4 on the rotary table 32a. When a predetermined time elapses after the operation of the heat-insulating mechanism 34 is initiated, the substrate processing apparatus 30 operates the rotary mechanism 32b to rotate the rotary table 32a about the axis X.

Figure 11:
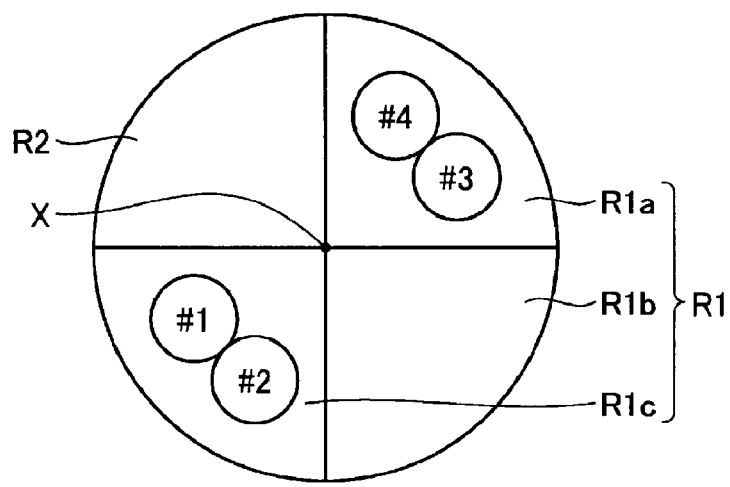
FIG. 11 is a view for explaining an example of a processing operation of a substrate processing apparatus according to an embodiment.

The wafers #1 and #2 held on the rotary table 32a move clockwise around the axis X with the rotation of the rotary table 32a, and reaches the third division region R1c of the first region R1, as illustrated in FIG. 11. Meanwhile, the wafers #3 and #4 held on the rotary table 32a move clockwise around the axis X with the rotation of the rotary table 32a, and reaches the first division region R1a of the first region R1, as illustrated in FIG. 11. When the wafers #1 and #2 held on the rotary table 32a reach the third division region R1c and the wafer #3 and #4 also reach the first division region R1a, the substrate processing apparatus 30 stops the rotary mechanism 32b to stop the rotation of the rotary table 32a. Then, the substrate processing apparatus 30 operates the heat-insulating mechanism 35 disposed in the third division region R1c so as to maintain the wafers #1 and #2 in the third division region R1c at the sublimation temperature. As a result, the reaction products generated by the COR process are continuously vaporized from the wafers #1 and #2. Meanwhile, the substrate processing apparatus 30 operates the temperature-raising mechanism 33 disposed in the first division region R1a so as to raise the temperature of the wafers #3 and #4 in the first division region R1a to the sublimation temperature. As a result, the reaction products generated by the COR process are vaporized from the wafers #3 and #4. When a predetermined time elapses after the operation of the temperature-raising mechanism 33 and the operation of the heat-insulating mechanism 35 are initiated, the substrate processing apparatus 30 operates the rotary mechanism 32b to rotate the rotary table 32a about the axis X.

Figure 12:
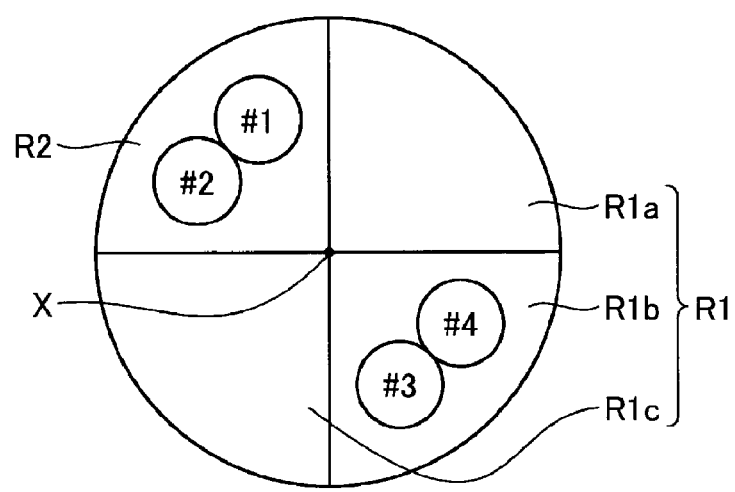
FIG. 12 is a view for explaining an example of a processing operation of a substrate processing apparatus according to an embodiment.

The wafers #1 and #2 held on the rotary table 32a move clockwise around the axis X with the rotation of the rotary table 32a, and reach the second region R2, as illustrated in FIG. 12. Meanwhile, the wafers #3 and #4 held on the rotary table 32a move clockwise around the axis X with the rotation of the rotary table 32a, and reaches the second division region R1b of the first region R1, as illustrated in FIG. 12. When the wafers #1 and #2 held on the rotary table 32a reach the second region R2 and the wafer #3 and #4 also reach the second division region Rib, the substrate processing apparatus 30 stops the rotary mechanism 32b to stop the rotation of the rotary table 32a. Then, the substrate processing apparatus 30 performs, in parallel, the heating process on the wafers #3 and #4 in the second division region R1b (the first region R1) by the heating mechanism and the cooling process on the wafers #1 and #2 in the second region R2 by the cooling mechanism. That is, the substrate processing apparatus 30 operates the heat-insulating mechanism 34 disposed in the second division region R1b so as to maintain the wafers #3 and #4 in the second division region R1b at the sublimation temperature. As a result, the reaction products generated by the COR process are continuously vaporized from the wafers #3 and #4. Meanwhile, while the wafers #3 and #4 are being heated by the heat-insulating mechanism 34, the substrate processing apparatus 30 operates the cooling plate 37 disposed in the second region R2 so as to cool the wafers #1 and #2 in the second region R2. As a result, the wafers #1 and #2 are cooled to a temperature appropriate for a subsequent COR process. In this way, the heating process and the cooling process are continuously performed on a plurality of wafers that have been subjected to the COR process.

When a predetermined time elapses after the operation of the heat-insulating mechanism 34 and the operation of the cooling plate 37 are initiated, the substrate processing apparatus 30 operates the lifting pins 39 so as to raise the wafers #1 and #2 from the rotary table 32a by the lifting pins 39. The wafers #1 and #2 raised from the rotary table 32a by the lifting pins 39 are taken out from the substrate transfer port 31c by the VTM arm 25.

In the examples of FIGS. 8 to 12, the heating process on the wafers #3 and #4 in the second division region Rib, which is the substrate-cooling region and not adjacent to the second region R2, and the cooling process on the wafers #1 and #2 in the second region R2 are performed in parallel. However, from the viewpoint of improving the throughput of the substrate processing apparatus 30, the heating process on the wafers in the first division region R1a, the heating process on the wafers in the second division region Rib, the heating process on the wafers in the third division region R1c, and the cooling process on the wafers in the second region R2 may be performed in parallel. That is, the substrate processing apparatus 30 may simultaneously operate the temperature-raising mechanism 33 disposed in the first division region R1a, the heat-insulating mechanism 34 disposed in the second division region Rib, the heat-insulating mechanism 35 disposed in the third division region R1c, and the cooling plate 37 disposed in the second region R2.

Hereinafter, an example of a method of processing substrates in the substrate processing apparatus 30 according to an embodiment will be described. In step S1, the substrate-heating region (that is, the first region R1) and the substrate-cooling region (that is, the second region R2) are adjusted (depressurized) to a first pressure. In step S2, the substrate-heating region or the substrate-cooling region is adjusted from the first pressure to a second pressure such that the pressure in the substrate-cooling region becomes higher than the pressure in the substrate-heating region. When adjusting the pressure in the substrate-heating region, the pressure in the substrate-heating region is reduced, and when adjusting the pressure in the substrate-cooling region, the pressure in the substrate-cooling region is increased. In step S3, a first substrate is transferred to the substrate-heating region, and a second substrate is transferred to the substrate-cooling region. For example, the first substrate is transferred to the substrate-heating region from the loading and unloading port (that is, the substrate transfer port 31c) of the substrate processing apparatus 30 provided in the substrate-cooling region, and the second substrate is heated in the substrate-heating region and then is transferred from the substrate-heating region to the substrate-cooling region. In other words, the second substrate is heated in the substrate-heating region before the first substrate is loaded into the substrate processing apparatus 30, and is transferred from the substrate-heating region to the substrate-cooling region, for example, when the first substrate loaded into the substrate processing apparatus 30 is transferred from the substrate-cooling region to the substrate-heating region. The transfer of the first substrate and the transfer of the second substrate may be performed simultaneously or at different timings. In step S4, the first substrate is heated in the substrate-heating region, and the second substrate is cooled in the substrate-cooling region. Specifically, the sealer 38 seals the second substrate, and then is pressurized to a third pressure different from the first pressure and the second pressure. Then, the second substrate is cooled. In step S5, the second substrate is unloaded from the substrate-cooling region to a VTM chamber (that is, the vacuum transfer chamber 20) through the loading and unloading port of the substrate processing apparatus 30, while the first substrate is moved to the second division region Rib, the third division region R1c, or the substrate-cooling region.

(Effect)

As described above, the substrate processing apparatus according to the embodiment described above includes a chamber, a heating mechanism, a cooling mechanism, and a partition. The chamber has a container including at least one substrate-heating region and at least one substrate-cooling region. The heating mechanism is configured to heat a first substrate in the at least one substrate-heating region. The cooling mechanism is configured to cool a second substrate in the at least one substrate-cooling region while the first substrate is being heated. The partition is provided in the container and is configured to separate the at least one substrate-heating region and the at least one substrate-cooling region from each other in terms of heat and pressure. Thus, the substrate processing apparatus according to the embodiment can perform a heating process and a cooling process on the substrates in a single chamber. When a heating processing chamber and a cooling processing chamber are provided separately in a substrate processing system, it takes time to transfer substrates between the heating processing chamber and the cooling processing chamber, and thus throughput of the substrate processing system is degraded. The substrate processing apparatus according to the embodiment described above continuously performs the heating process and the cooling process on the substrates in the substrate-heating region and the substrate-cooling region, respectively, which are provided in a single chamber and separated from each other by the partition in terms of heat and pressure. Thus, according to the present embodiment, it is possible to omit transfer of substrates between different chambers, and to improve the throughput of the substrate processing system.

In addition, the substrate processing apparatus according to the embodiment described above further includes a sealer, which is provided in at least one substrate-cooling region and configured to seal a substrate when cooling the substrate. Thus, in the substrate processing apparatus according to the embodiment, it is possible to double the separation of the substrate-heating region and the substrate-cooling region by the partition and the sealer, and to improve the cooling efficiency of the substrate. That is, during the cooling process, it is possible to cool the substrate while increasing the pressure in a short time by forming a narrow region by an internal partition (i.e., the sealer). In addition, by separating the substrate-heating region and the substrate-cooling region from each other, a gas sublimated in the substrate-heating region is prevented from adhering again to the substrate in the substrate-cooling region. That is, since the relationship of "the pressure inside the sealer>the pressure in the substrate-heating region" is established, the gas does not infiltrate into the sealed space inside the sealer. In addition, by forming a double partition, it is possible to isolate the sealed space inside the sealer from the substrate-heating region, which further contributes to preventing deposition from adhering to the substrate.

In addition, the substrate processing apparatus according to the embodiment described above further includes a transfer mechanism configured to transfer the substrate between the at least one substrate-heating region and the at least one substrate-cooling region. Further, the sealer includes a first movable member and a second movable member. The first movable member and the second movable member are configured to approach each other when the substrate is cooled by the cooling mechanism so as to seal the substrate, and are configured to be separated from each other when the substrate is transferred by the transfer mechanism so as to release the seal. Thus, the substrate processing apparatus according to the embodiment can continuously perform the heating process and the cooling process on the substrate by transferring the substrate between the substrate-heating region and the substrate-cooling region in a single chamber.

In the substrate processing apparatus according to the embodiment described above, the transfer mechanism includes a holder configured to hold a plurality of substrates, and a rotary mechanism configured to rotate the holder. Thus, the substrate processing apparatus according to the embodiment can continuously perform heating process and the cooling process on the substrates by transferring the substrates between the substrate-heating region and the substrate-cooling region in a single chamber by rotation of the holder.

In the substrate processing apparatus according to the embodiment described above, the first movable member and the second movable member have a seal member on an end surface facing the holder. In addition, the first movable member and the second movable member are configured to seal the substrate by approaching each other to bring the seal members into contact with the holder when the substrate is cooled by the cooling mechanism. Thus, the substrate processing apparatus according to the embodiment can further improve the cooling efficiency of the substrate.

In addition, in the substrate processing apparatus according to the embodiment described above, the at least one substrate-heating region includes at least one substrate temperature-raising region and at least one substrate heat-insulating region. The heating mechanism includes a temperature-raising mechanism configured to raise the temperature of the substrate in the at least one substrate temperature-raising region to the sublimation temperature, and a heat-insulating mechanism configured to maintain the temperature of the substrate in the at least one substrate heat-insulating region at the sublimation temperature. Thus, by providing one or more substrate heat-insulating regions, the substrate processing apparatus according to the embodiment can simultaneously and efficiently heat a plurality of substrates according to the number of substrate heat-insulating regions.

In the substrate processing apparatus according to the embodiment described above, the temperature-raising mechanism includes a radiation source that emits light having a specific wavelength capable of heating a substrate, and the heat-insulating mechanism includes a resistance heating element. Thus, the substrate processing apparatus according to the embodiment can further improve the heating efficiency of the substrate.

In addition, the substrate processing apparatus according to the embodiment described above has a controller configured to simultaneously operate the temperature-raising mechanism, the heat-insulating mechanism, and the cooling mechanism. Thus, the substrate processing apparatus according to the embodiment can reduce the processing time when the heating process and the cooling process are continuously performed on the substrate.

In the substrate processing apparatus according to the embodiment described above, the chamber has a substrate transfer port for performing delivery of the substrate to and from the outside. The substrate transfer port is provided in at least one substrate-cooling region. Thus, the substrate processing apparatus according to the embodiment can smoothly unload the substrate cooled in the substrate-cooling region from the substrate transfer port.

According to the present disclosure, it is possible to perform a heating process and a cooling process on a substrate in a single chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus comprising:
 a chamber having a container including at least one substrate-heating region and at least one substrate-cooling region;
 a heating mechanism configured to heat a first substrate in the at least one substrate-heating region;
 a cooling mechanism configured to cool a second substrate in the at least one substrate-cooling region while the first substrate is being heated;
 a partition provided in the container and configured to separate the at least one substrate-heating region and the at least one substrate-cooling region from each other in terms of heat and pressure;
 a sealer provided in the at least one substrate-cooling region and configured to seal a substrate when cooling the substrate; and
 a transfer mechanism configured to transfer the substrate between the at least one substrate-heating region and the at least one substrate-cooling region,
 wherein the sealer includes a first movable member and a second movable member, and
 wherein the first movable member and the second movable member are configured to approach each other when the substrate is cooled by the cooling mechanism so as to seal the substrate, and are configured to be separated from each other when the substrate is transferred by the transfer mechanism so as to release the seal.

2. The substrate processing apparatus of claim 1, wherein the transfer mechanism includes a holder configured to hold a plurality of substrates, and a rotary mechanism configured to rotate the holder.

3. The substrate processing apparatus of claim 2, wherein the first movable member and the second movable member have seal members on end faces facing the holder, respectively, and wherein the first movable member and the second movable member are configured to seal the substrate when the substrate is cooled by the cooling mechanism by approaching each other and bringing the seal members into contact with the holder.

4. The substrate processing apparatus of claim 3, wherein the at least one substrate-heating region includes at least one substrate temperature-raising region and at least one substrate heat-insulating region, and wherein the heating mechanism includes a temperature-raising mechanism configured to raise a temperature of the substrate in the at least one substrate temperature-raising region to a sublimation temperature, and a heat-insulating mechanism configured to maintain the temperature of the substrate in the at least one substrate heat-insulating region at the sublimation temperature.

5. The substrate processing apparatus of claim 4, wherein the temperature-raising mechanism includes a radiation source configured to emit light having a specific wavelength.

6. The substrate processing apparatus of claim 5, wherein the heat-insulating mechanism includes at least one of a resistance heating element, a radiation source configured to emit light having a specific wavelength, and a heating gas supply element.

7. The substrate processing apparatus of claim 6, further comprising a controller configured to simultaneously operate the temperature-raising mechanism, the heat-insulating mechanism, and the cooling mechanism.

8. The substrate processing apparatus of claim 7, wherein the chamber has a substrate transfer port provided in the at least one substrate-cooling region and configured to perform delivery of the substrate to and from an outside.

* * * * *